US012635272B2

(12) United States Patent (10) Patent No.: US 12,635,272 B2

Chen et al. (45) Date of Patent: May 19, 2026

(54) ARTIFACT-REDUCING PIXEL AND METHOD

(71) Applicant: OmniVision Technologies, Inc., Santa Clara, CA (US)

(72) Inventors: Gang Chen, San Jose, CA (US); Shiyu Sun, Cupertino, CA (US); Yuanwei Zheng, San Jose, CA (US); Armin Yazdani, New York, NY (US)

(73) Assignee: OmniVision Technologies, Inc., Santa Clara, CA (US)

( * ) Notice: Subject to any disclaimer, the term of this patent is extended or adjusted under 35 U.S.C. 154(b) by 441 days.

(21) Appl. No.: 17/475,876

(22) Filed: Sep. 15, 2021

(65) Prior Publication Data

US 2023/0079156 A1     Mar. 16, 2023

(51) Int. Cl.
H10F 39/00 (2025.01)

(52) U.S. Cl.
CPC ....... H10F 39/8023 (2025.01); H10F 39/026 (2025.01); H10F 39/80373 (2025.01)

(58) Field of Classification Search
CPC ......... H01L 27/14605; H01L 27/14614; H01L 27/14632; H10F 39/026; H10F 39/8023; H10F 39/80373
See application file for complete search history.

(56) References Cited

U.S. PATENT DOCUMENTS

| | | | |
|---|---|---|---|
| 2015/0155328 A1* | 6/2015 | Park | H01L 27/14627 |
| | | | 257/292 |
| 2016/0071974 A1* | 3/2016 | Laven | H01L 29/0696 |
| | | | 257/334 |
| 2016/0218138 A1* | 7/2016 | Oishi | H01L 27/14607 |
| 2016/0240570 A1 | 8/2016 | Barna et al. | |
| 2017/0200759 A1* | 7/2017 | Ihara | H10F 39/807 |
| 2021/0327947 A1* | 10/2021 | Lin | H01L 29/4236 |

* cited by examiner

*Primary Examiner* — Meiya Li

(74) *Attorney, Agent, or Firm* — Cozen O'Connor

(57) ABSTRACT

A pixel includes a semiconductor substrate that includes a floating diffusion region and a photodiode region. The pixel also includes, between a front surface of the semiconductor substrate and a back surface opposing the front surface: a first trench and a second trench adjacent to the first trench in a separation direction that is both (a) parallel to the front surface and (b) in a plane that is perpendicular to the front surface. Each of the first and second trench (a) is between the floating diffusion region and the photodiode region and (b) extends into the semiconductor substrate from the front surface. In the separation direction, a top average-separation between the first and second trench, at depths between the front surface and a first depth in the semiconductor substrate, exceeds a bottom average-separation between the first and second trench, at depths exceeding the first depth.

17 Claims, 10 Drawing Sheets

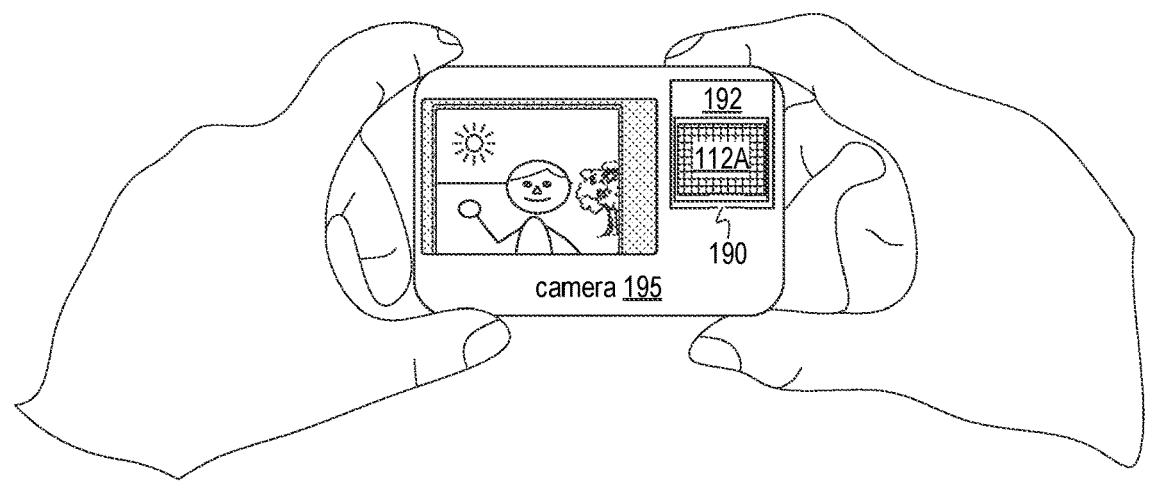
FIG. 1
FIG. 2
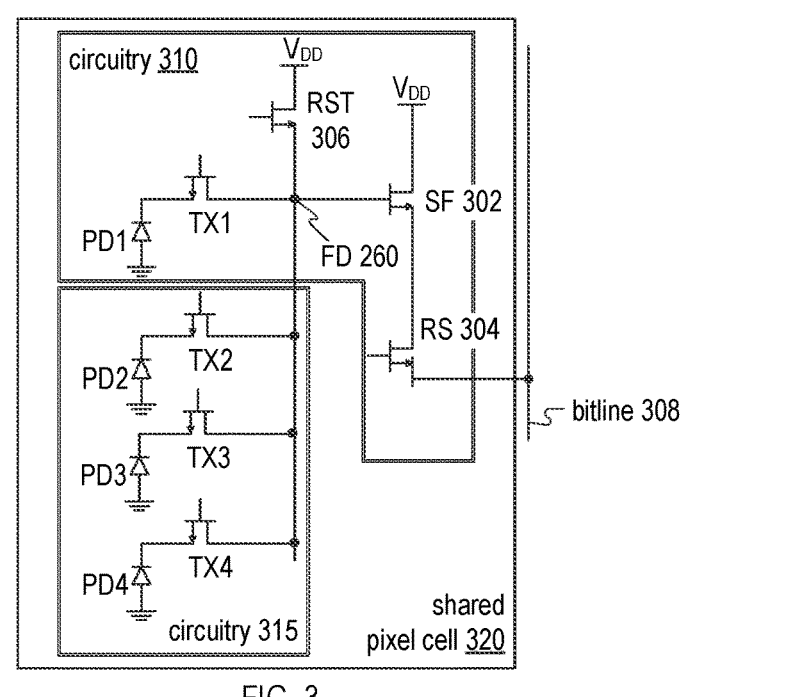
FIG. 3

1200

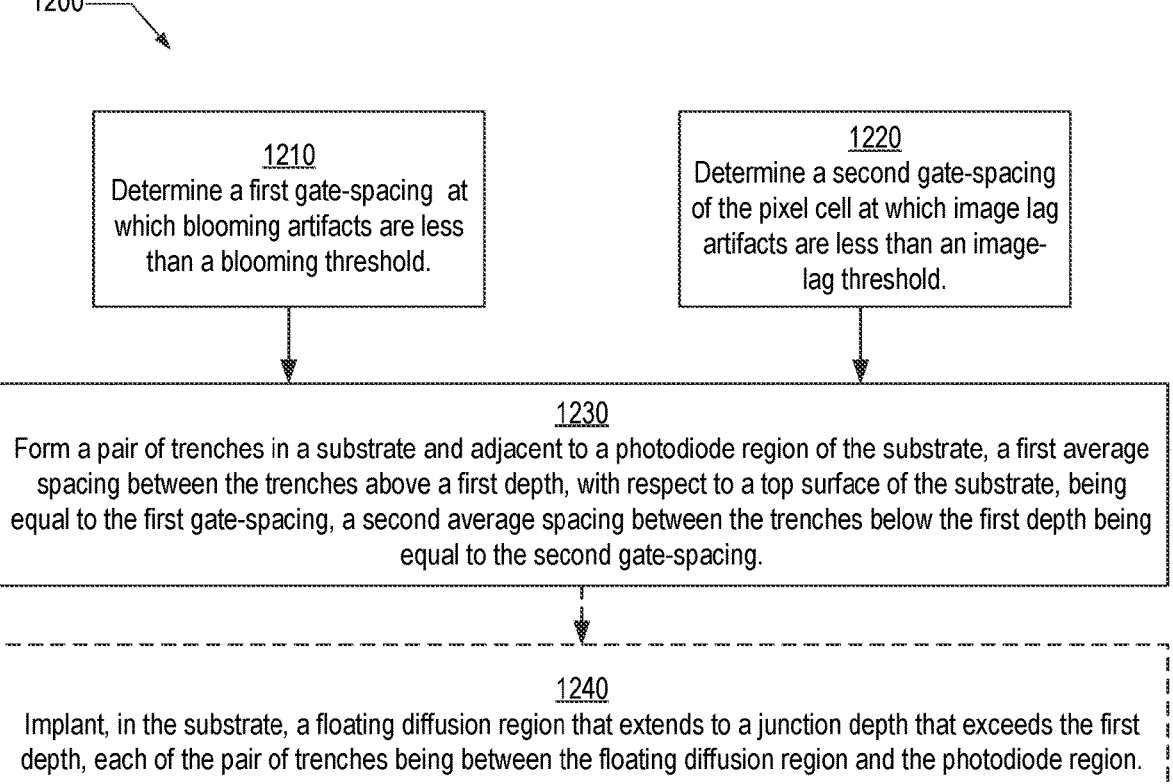

1210
Determine a first gate-spacing at which blooming artifacts are less than a blooming threshold.

1220
Determine a second gate-spacing of the pixel cell at which image lag artifacts are less than an image-lag threshold.

1230
Form a pair of trenches in a substrate and adjacent to a photodiode region of the substrate, a first average spacing between the trenches above a first depth, with respect to a top surface of the substrate, being equal to the first gate-spacing, a second average spacing between the trenches below the first depth being equal to the second gate-spacing.

1240
Implant, in the substrate, a floating diffusion region that extends to a junction depth that exceeds the first depth, each of the pair of trenches being between the floating diffusion region and the photodiode region.

FIG. 12

ARTIFACT-REDUCING PIXEL AND METHOD

BACKGROUND

Camera modules in commercial products such as stand-alone digital cameras, mobile devices, automotive components, and medical devices include an image sensor and a pixel array thereof. The pixel array includes a plurality of pixels. A pixel array's pixel density is the number of pixels per unit area on the image sensor. In operation, the lens of a camera module forms an image, on the image sensor, of an object in its field of view. The object can be viewed as a plurality of infinitesimally small point-sources of illumination—"impulses"—incident on the camera. The lens images each of the plurality of impulses at a plane of the pixel array as a respective one of a plurality of point-spread functions—"impulse responses." The resolution of images captured by the image sensor depends in part on pixel size compared to the size of the impulse response. Accordingly, one way to increase a camera's maximum attainable resolution is to increase pixel density by decreasing pixel size. Motivation to decrease pixel sizes has led to development of pixels with vertical transfer gates.

Each pixel of the plurality of pixels includes a photodiode, a floating diffusion region, and a transfer gate formed in a pixel-array substrate, which is part of the image sensor. The transfer gate controls electron flow from the photodiode to the floating diffusion region and may be part of a field-effect transistor. Light reaching the photodiode generates photoelectrons. Turning on the transfer gate forms a conducting channel that allows the accumulated photoelectrons to transfer or flow from the photodiode to the floating diffusion region. When the transfer gate is pulsed to an off-state, the associated potential is lower than that of the photodiode raising a barrier in the corresponding energy band diagram to block electron flow from photodiode to floating diffusion region, hence preventing photoelectrons from flowing to the floating diffusion region.

In one common pixel architecture, the photodiode and the floating diffusion region are laterally displaced within the pixel, in a lateral direction parallel to a plane of the pixel array, with the transfer gate therebetween. This plane is horizontally oriented with respect to the vertical direction perpendicular thereto that defines the direction of normally-incident light (illumination) reaching the pixel array. Such a horizontal orientation limits how much the pixel density can be increased. Hence, one way to increase both pixel density and the photodiode's full well capacity is to orient the photodiode, transfer gate, and floating diffusion region in a direction that has a vertical component. Such transfer gates are examples of vertical transfer gates.

SUMMARY OF THE EMBODIMENTS

In some imaging scenarios, blooming artifacts and image lag degrade the quality of images captured by image sensors whose pixels include vertical transfer gates, herein also referred to as vertical gates. Blooming is a type of optical crosstalk that occurs when, in response to light incident on a pixel, the quantity of photoelectrons accumulated in a pixel's photodiode exceeds the pixel's saturation level (full well capacity), such that excess photoelectrons are detected by one or more adjacent pixels.

Image lag can occur when pulsing the transfer gate does not completely deplete the photodiode of collected charge in a pixel such that residual signal remains during successive readings of the pixel. The resulting insufficient, or incomplete, charge transfer results in image lag that manifests as black dots in images produced by the camera.

When pixels include a pair of vertical transfer gates located between the photodiode and the floating diffusion region, a spacing between the vertical transfer gates may be uniform as function of depth beneath the front surface of the pixel-array substrate. Decreasing the uniform spacing enables a stronger electrical field and reduces image lag at the expense of increased blooming that occurs when the pair of vertical transfer gate is turned off, while increasing the spacing decreases blooming at the expense of increased image lag. Embodiments disclosed herein overcome this trade-off by introducing non-uniform spacing between the pair of vertical transfer gates.

In a first aspect, a pixel includes a semiconductor substrate that includes a floating diffusion region and a photodiode region. The pixel also includes, between a front surface of the semiconductor substrate and a back surface opposing the front surface: a first trench and a second trench adjacent to the first trench in a separation direction that is both (a) parallel to the front surface and (b) in a plane that is perpendicular to the front surface. Each of the first and second trench (a) is between the floating diffusion region and the photodiode region and (b) extends into the semiconductor substrate from the front surface. In the separation direction, a top average-separation between the first and second trench, at depths between the front surface and a first depth in the semiconductor substrate, exceeds a bottom average-separation between the first and second trench, at depths exceeding the first depth.

In a second aspect, a pixel cell includes a semiconductor substrate and a plurality of transfer gates. The semiconductor substrate includes a floating diffusion region, a plurality of photodiodes, and a front surface. Each of the plurality of transfer gates (i) is located on a surface of the semiconductor substrate, (ii) couples a respective one of the plurality of photodiodes to the floating diffusion region, and (iii) includes a planar gate, a first vertical gate, and a second vertical gate laterally displaced from the first vertical gate in a separation direction. Each of the first vertical gate and the second vertical gate extends from the planar gate into the semiconductor substrate. The first and the second vertical gates are proximate to the respective one of the plurality of photodiodes. In the separation direction, a top average-separation between the first and the second vertical gates and between the front surface and a first depth in the semiconductor substrate exceeds a bottom average-separation between the first and the second vertical gates at depths exceeding the first depth. The separation direction is parallel to the front surface and in a plane that is (i) perpendicular to the front surface and (ii) intersects both the first and the second vertical gates.

In a third aspect, a method for creating an artifact-reduced pixel of an image sensor, the method includes: (i) determining a first gate-spacing of the pixel cell at which blooming artifacts are less than a blooming threshold; (ii) determining a second gate-spacing of the pixel cell at which image lag artifacts are less than an image-lag threshold; and (iii) forming a pair of trenches in a substrate and adjacent to a photodiode region of the substrate. A first average spacing between the trenches above a first depth, with respect to a top surface of the substrate, is equal to the first gate-spacing. A second average spacing between the trenches below the first depth is equal to the second gate-spacing.

BRIEF DESCRIPTION OF THE FIGURES

FIG. 1 depicts a camera imaging a scene.

FIG. 2 is a cross-sectional schematic of a pixel-array substrate, which is an embodiment of a pixel-array substrate of the camera of FIG. 1.

FIG. 3 is a circuit diagram of a shared pixel, which is a candidate pixel circuitry architecture of a pixel of FIG. 2.

FIG. 12 is a flowchart illustrating a method for creating an artifact-reduced pixel cell of an image sensor, in an embodiment.

DETAILED DESCRIPTION OF THE EMBODIMENTS

Figure 4:
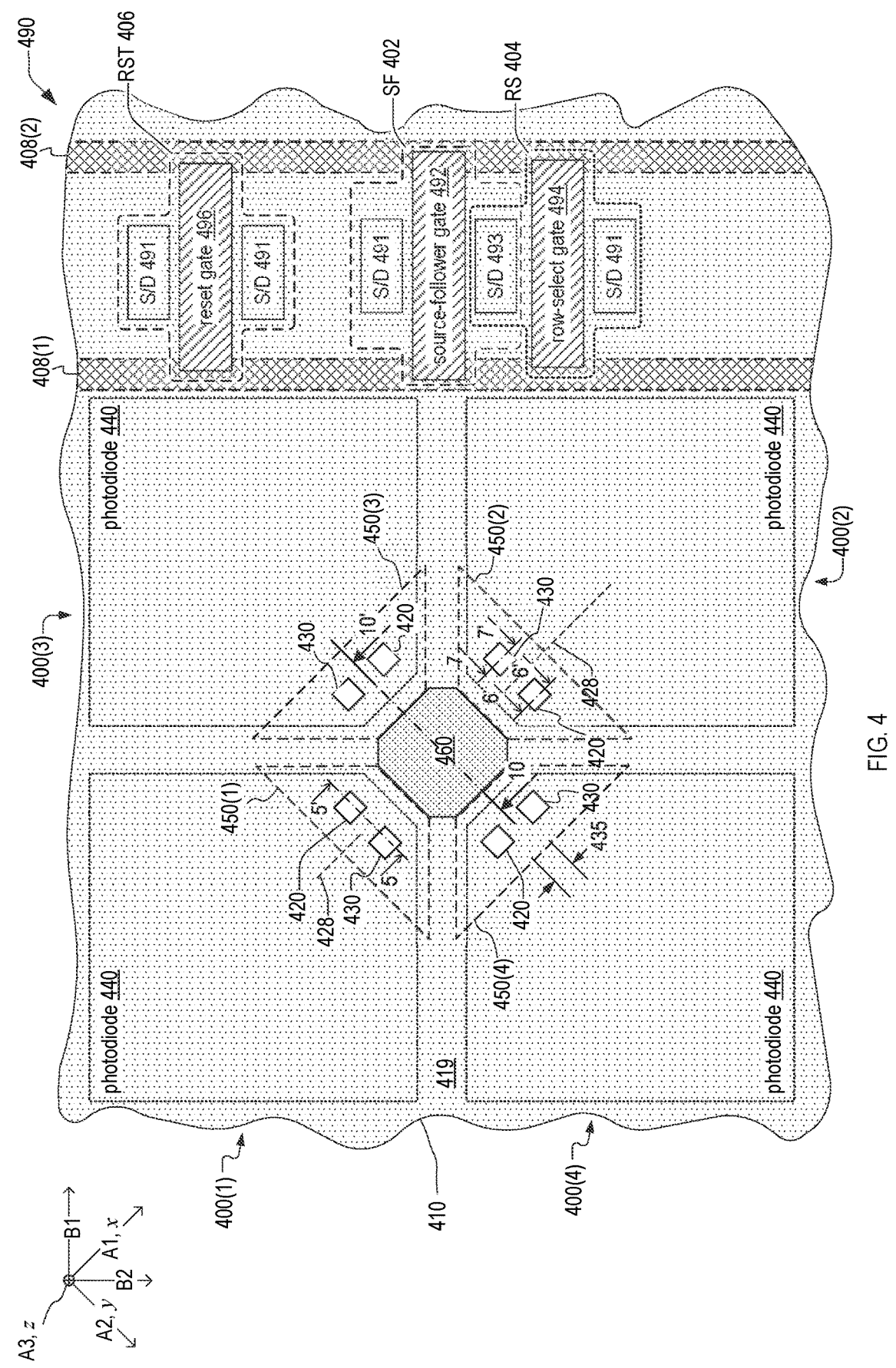
FIG. 4 is a schematic plan view of a pixel-array substrate that includes multiple pixel cells, the pixel-array substrate being an example of the pixel-array substrate of FIG. 2.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed of one or more semiconductors such as silicon, silicon-germanium, germanium, gallium arsenide, and other semiconductor materials known to those of skill in the art. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate. It should be noted that element names and symbols may be used interchangeably through this document (e.g., Si vs. silicon); both have identical meanings.

FIG. 1 depicts a camera 195 imaging a scene. Camera 195 includes an image sensor 192, which includes a pixel-array substrate 190. Constituent elements of pixel-array substrate 190 may include at least one of silicon and germanium. Pixel-array substrate 190 includes a pixel array 112A. Image sensor 192 may be part of a chip-scale package or a chip-on-board package. Camera 195 is shown as a component of a handheld device, but it should be appreciated that other devices, such as security devices, automobile cameras, drone cameras, etc. may utilize camera 195 without departing from the scope hereof.

FIG. 2 is a cross-sectional schematic of a pixel-array substrate 290, which is an example of pixel-array substrate 190 of image sensor 192. The cross-section illustrated in FIG. 2 is parallel to a plane, hereinafter the x-z plane, formed by orthogonal axes A1 and A3, which are each orthogonal to an axis A2. Herein, the x-y plane is formed by orthogonal axes A1 and A2, and planes parallel to the x-y plane are referred to as transverse planes. Unless otherwise specified, heights of objects herein refer to the object's extent along axis A3. Herein, a reference to an axis x, y, or z refers to axes A1, A2, and A3 respectively. Also, herein, a horizontal plane is parallel to the x-y plane, a width refers to an object's extent along the x or y axis respectively, and a vertical direction is along the z axis. FIG. 4 also denotes axes B1 and B2, which in embodiments are rotated by forty-five degrees with respect to axes A1 and A2, respectively and denote respective directions of rows and columns of pixels forming a pixel array in semiconductor substrate 410.

Pixel-array substrate 290 includes a semiconductor substrate 210, which has a bottom substrate surface 211 and a front substrate surface 219, each of which may be perpendicular to axis A3. Herein, front substrate surface 219 may be referred to as the front side surface of semiconductor substrate 210 and bottom substrate surface 211 may be referred to as the backside surface of semiconductor substrate 210. Herein, front substrate surface 219 may be referred as the non-illuminated surface of semiconductor substrate 210 and bottom substrate surface 211 opposite to front substrate surface 219 may be referred to as the illuminated surface of semiconductor substrate 210.

Semiconductor substrate 210 includes a plurality of pixels 212 that form a pixel array 212A, which is an example of pixel array 112A. Pixels 212 are arranged in a plurality of rows and columns along axes A1 and A2 respectively. Pixel array 212A has a diagonal pixel pitch 213 along axis A1. Along axis A2 pixel array 212A has pitch that, in embodiments, equals diagonal pixel pitch 213. In embodiments, diagonal pixel pitch 213 is between 1.0 μm to 3.0 μm, which corresponds to a range of standard pixel pitch between 0.7 μm to 2.0 μm. In embodiments, diagonal pixel pitch 213 is between 1.0 μm and 1.6 μm.

FIG. 3 is a circuit diagram of a four-transistor ("4T") circuitry 310, which is a candidate pixel circuitry architecture of pixel 212. Circuitry 310 includes a photodiode PD1, a transfer transistor TX1, a reset transistor 306, a source-follower transistor 302, and a row-select transistor 304. Circuitry 310 is electrically connected to a column bitline 308 of image sensor 192. FIGS. 2 and 3 are best viewed together in the following description.

In embodiments, each pixel 212 is one of multiple pixels of a shared pixel cell. FIG. 3 depicts a shared pixel-cell 320, which is candidate pixel circuitry architecture for the shared pixel cell. Shared pixel-cell 320 includes circuitry 310 and circuitry 315. Circuitry 315 includes additional respective photodiodes PD2-PD4 and transfer transistors TX2-TX4 of three additional pixels of the shared pixel-cell. Circuitry 315 and circuitry 310 represent pixel circuitry for a shared pixel-cell 320. Herein, transfer transistor TX refers to one of transfer transistors TX1-TX4.

Each pixel 212 includes a respective photodiode 240, a respective transfer transistor (e.g., transfer transistor TX) having vertical transfer gate 280, and a floating diffusion region 260. In embodiments, multiple pixels 212 share a common floating diffusion region 260, in which case the multiple pixels are part of a same shared pixel cell.

Photodiode 240 of each pixel 212 is at least partially embedded in pixel-array substrate 290 and is configured to generate and accumulate charges in response to incident light (illumination) thereon, for example, incident on bottom substrate surface 211 (e.g., backside surface of semiconductor substrate 210) during an integration period of the image sensor 192. Photodiode 240 is an example of any one of photodiodes PD1-PD4 of FIG. 3. In embodiments, photodiode 240 and floating diffusion region 260 are a source and a drain, respectively, of transfer transistor TX.

Electrical connection of photodiode 240 to floating diffusion region 260 depends on voltage applied to a transfer gate (e.g., vertical transfer gate 280) of the respective transfer transistor (e.g., transfer transistor TX) associated with pixel 212. Charges, e.g., photoelectrons, photo-generated and accumulated in photodiode 240 of respective pixel 212 can be selectively transferred to floating diffusion region 260 depending on voltage applied to the transfer gate (e.g., vertical transfer gate 280) of the respective transfer transistor associated with pixel 212, for example during a subsequent charge transfer period. Photodiode 240 may be in various configurations including, but not limited to, a pinned photodiode configuration and a partially pinned photodiode configuration. In embodiments, a pinning layer having conductivity opposed to photodiode 240 (e.g., the pinning layer is a p-type doped layer when photodiode 240 is n-type) is disposed between front substrate surface 219 of semiconductor substrate 210 and photodiode region of photodiode 240, wherein the pinning layer is coupled to a ground. In embodiments, charges accumulate in photodiode 240 during an integration period of image sensor 192.

A transfer gate (e.g., vertical transfer gate 280) of each transfer transistor (e.g., vertical gate electrode of transfer transistor TX1) is formed in a respective trench 220 defined by a side trench-surface 222 and a bottom trench-surface 224 of front substrate surface 219.

In embodiments, each pixel 212 is a pixel unit in a shared pixel cell and each pixel cell further includes reset transistor 306, source-follower transistor 302, and row-select transistor 304 shared by pixel 212 in the shared pixel cell. In FIG. 3, reset transistor 306, source-follower transistor 302, and row-select transistor 304 are abbreviated as RS 306, SF 302, and RST 304, respectively. Reset transistor 306 is coupled between a power line and floating diffusion region 260 to reset (e.g., discharge residual charges in floating diffusion region 260 and charge floating diffusion region 260 to a preset voltage e.g., a supply voltage $V_{DD}$) under control of a reset signal during a reset period. Reset transistor 306 is further coupled to photodiode 240 (e.g., one of photodiodes PD1-PD4) through the respective transfer transistor TX (e.g., transfer transistor TX1-TX4) to reset respective photodiode 240 to the preset voltage during the reset period. Floating diffusion region 260 is coupled to a gate of source-follower transistor 302. Source-follower transistor 302 is coupled between the power line and row-select transistor 304. Source-follower transistor 302 operates to modulate an image signal based on the voltage of floating diffusion region 260, where the image signal corresponds to the amount photoelectrons accumulated in photodiode 240 of each pixel during the integration period at the gate thereof. Row-select transistor 304 selectively couples the output (e.g., image signal) of source-follower transistor 302 to the readout column line (for example, column bitline 308) under control of a row select signal.

In operation, during the integration period (also referred to as an exposure or accumulation period) of image sensor 192, photodiode 240 detects or absorbs light incident on pixel 212 and photogenerates one or more charges. During the integration period, each of the transfer transistors TX1-TX4 is turned off, i.e., vertical transfer gate 280 of the respective transfer transistor TX1-TX4 receives a cut-off signal (e.g., a negative biasing voltage). The photogenerated charge accumulated in photodiode 240 is indicative of the amount of light incident on photodiode 240. After the integration period, each of the transfer transistors TX1-TX4 is turned on forming a conduction channel along the vertical transfer gate structure and transfers the photogenerated charge from photodiode 240 to floating diffusion region 260 through the conduction channel upon reception of a transfer signal (e.g., a positive biasing voltage) at vertical transfer gate 280 of transfer transistors TX1-TX4. Source-follower transistor 302 generates the image signal based on accumulated charges in floating diffusion region 260. Row-select transistor 304 coupled to source-follower transistor 302 then selectively reads out the signal onto a column bitline 308 for subsequent image processing.

In embodiments, vertical transfer gate structures disclosed herein are part of a shared-type pixel cell where floating diffusion region 260 is shared by multiple photodiodes. Vertical transfer gate structures disclosed herein may apply to any of a variety of additional or alternative types of pixel cell, e.g. a four-transistor pixel cell, five-transistor pixel cell, or a six-transistor pixel cell.

FIG. 4 is a schematic plan view of a region of a pixel-array substrate 490, which is an example of pixel-array substrate 290, FIG. 2. Pixel-array substrate 490 includes a semiconductor substrate 410 that includes photodiodes 440, and a floating diffusion region 460, which are examples of semiconductor substrate 210, photodiodes 240, and floating diffusion region 260, respectively. Semiconductor substrate 410 also includes at least one trench 420 and at least one trench 430.

In embodiments, pixel-array substrate 490 also includes a source-follower transistor 402, which is an example of source-follower transistor 302. Source-follower transistor 402 includes source/drain regions 491, 493 disposed in pixel-array substrate 490 and a source-follower gate 492 on the pixel-array substrate 490 and coupled between source/drain regions 491, 493. The source-follower gate 492 is electrically coupled to floating diffusion region 460, for example by contact and one or more metal interconnect. Pixel-array substrate 490 may also include at least one of row-select transistor 404 and a reset transistor 406. Reset transistor 406 includes a pair of source/drain regions 491 disposed in pixel-array substrate 490 and a reset gate 496, which is disposed on the pixel-array substrate 490 and coupled between source/drain regions 491. One of the source/drain region 491 of reset transistor 406 is coupled to a power line and the other source/drain region 491 of reset transistor 406 is coupled to floating diffusion region 460. Row-select transistor 404 includes a source/drain region 491 and source/drain region 493 disposed in pixel-array substrate 490, and row-select gate 494, which is disposed on the pixel-array substrate 490 and coupled between source/drain regions 491, 493. Source/drain region 493 is part of both source-follower transistor 402 and row-select transistor 404 such that the drain of source-follower transistor 402 is the source of row-select transistor 404. Source/drain region 491 of row-select transistor 404 is coupled to a bitline. Row-select transistor 404 and reset transistors 406 are examples of row-select transistor 304 and reset transistors 306 of FIG. 3, respectively. In embodiments, pixel-array substrate 490 includes shallow-trench isolation (STI) structures 408(1) and 408(2), which provide isolation between photodiodes 440 and each of transistors 402, 404, and 406, wherein at least part of each of transistors 402, 404, and 406 is between STI structures 408(1) and 408(2). Each STI structure 408 includes a dielectric material filling a trench formed in a front surface 419 of semiconductor substrate 410. At least part of front surface 419 is parallel to the x-y plane.

In embodiments, a gate width of source-follower gate 492 along axis B1 is larger than a gate width of row-select gate 494 along axis B1. In embodiments, a gate length of source-follower gate 492 along axis B2 is larger than a gate length of row-select gate 494 along axis B2. In embodiments, a gate width of source-follower gate 492 along axis B1 is larger than a gate width of reset gate 496. In embodiments, a gate length of source-follower gate 492 along axis B2 is larger than a gate length of reset gate 496 along axis B2. In embodiments, a gate area of source-follower gate 492 is larger than a gate area of at least one of row-select gate 494 and reset gate 496 to improve random telegraph noise (RTS) performance.

FIG. 4 illustrates transistors 402, 404, and 406 on a same side of floating diffusion region 460 (the right side as FIG. 4 is oriented). Without departing from the scope of the embodiments, transistors 402 and 404 may be on a different side of floating diffusion region 460, e.g., above, below, or the left side, and being similarly oriented and positioned with respect to additional STI structures 408 that are oriented parallel to said different side. For example, pixel-array substrate 490 may include said additional STI structures 408, which in embodiments are oriented parallel to axis B1 and located above or below floating diffusion region 460.

FIG. 4 illustrates multiple pixels 400 of a shared pixel cell. In the example of FIG. 4, the shared pixel cell includes four pixels 400(1-4). A pixel cell may have more or fewer than four pixels without departing from the scope of the embodiments.

Pixels 400(1-4) share the following elements: floating diffusion region 460, source-follower transistor 402, row-select transistor 404, and reset transistor 406. Each pixel 400(k) has a respective photodiode 440(k), where index k is a positive integer less than or equal to four. Each photodiode 440 of a pixel 400 transfers photo-generated charges to floating diffusion region 460. In the embodiment of FIG. 4, pixels 400(k) form a two-by-two pixel array. Pixel 400 is an example of pixel 212, FIG. 2.

Semiconductor substrate 410 has front surface 419 and a back surface 411 (not included in FIG. 4) thereopposite. Front surface 419 is an example of front substrate surface 219. FIG. 4 is shown from the perspective of viewing through front surface 419, where front surface 419 may cover one or more of the components shown in FIG. 4. Each of trenches 420 and 430 have a cross-sectional shape in the x-y plane, illustrated as being square in FIG. 4. In embodiments, the cross-sectional shape is other than square, such as circular, elliptical, rectangular, or more generally polygonal. In embodiments, trenches 420 and 430 have same or different trench profiles.

FIG. 4 denotes cross-sectional planes 6-6' and 7-7', each of which is parallel to the x-z plane. Cross-sectional plane 6-6' intersects photodiode 440, floating diffusion region 460, and trench 420 therebetween. Cross-sectional plane 7-7' intersects photodiode 440, floating diffusion region 460, and trench 430 therebetween. In embodiments, each of cross-sectional planes 6-6' and 7-7' intersects at trench 420 and a trench 430 on opposite sides of floating diffusion region 460, as illustrated in FIG. 4. In other embodiments, cross-sectional plane 6-6' intersects two trenches 420 on opposite sides of floating diffusion region 460, and cross-sectional plane 7-7' intersects two trenches 430 on opposite sides of floating diffusion region 460.

Each pixel 400(k) includes trench 420 and a trench 430. Within a pixel 400, each of trench 420 and trench 430 is between photodiode 440 and floating diffusion region 460 in either of axis A1 (for pixels 400(1, 2)) or axis A2 (for pixels 400(3, 4)). In pixels 400(1, 2) trench 420 is laterally displaced from trench 430 along axis A2. In pixels 400(3, 4) trench 420 is laterally displaced from trench 430 along axis A1.

Figure 9:
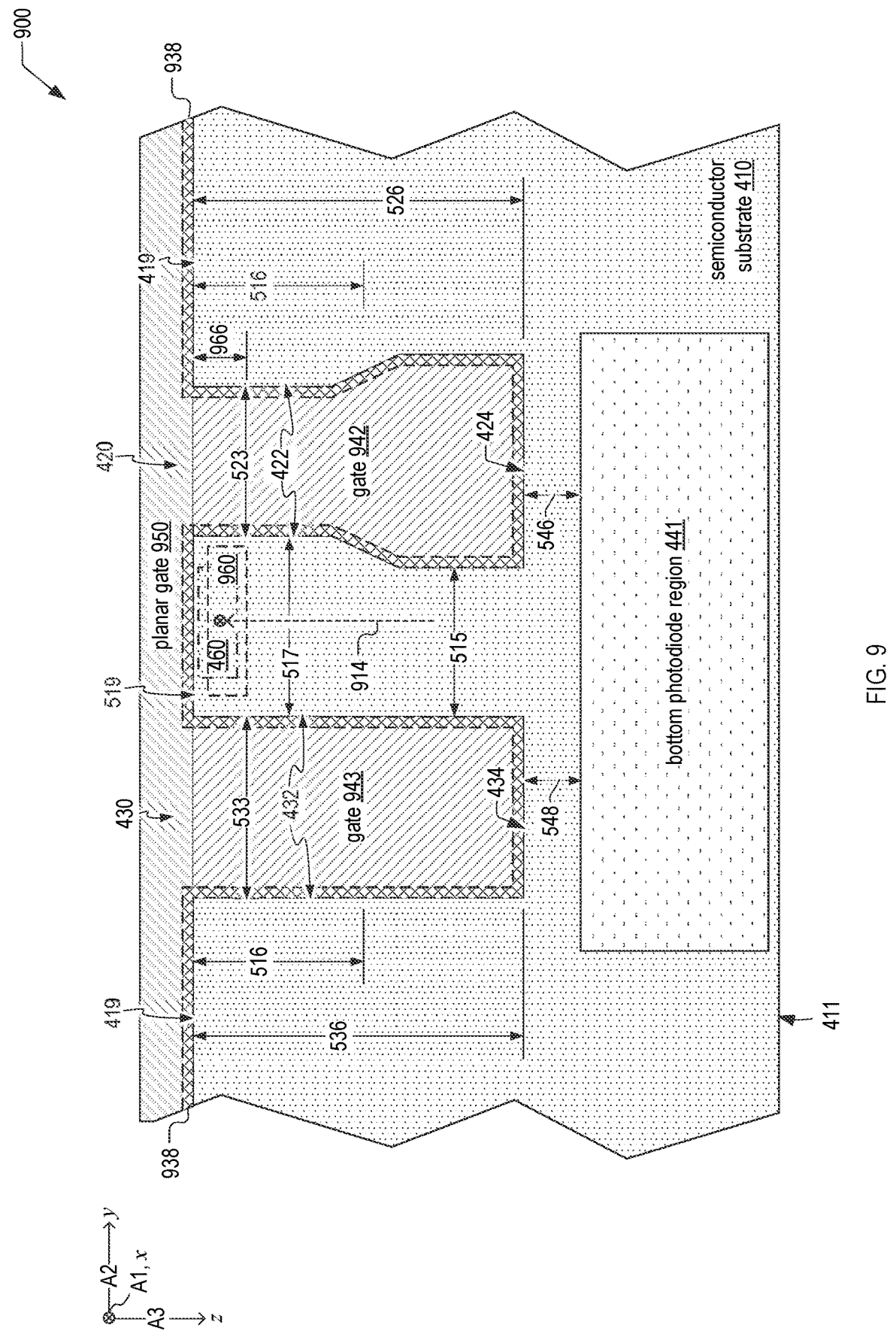
FIGS. 9 and 10 are respective cross-sectional views of the pixel cell of FIG. 4 with the addition of a planar gate and two vertical gates, in a first embodiment.

In embodiments, pixel-array substrate 490 includes vertically-oriented gates filling each of trenches 420 and 430, and planar gates 450(1-4) electrically connecting the respective pair of vertically-oriented gates therebeneath. In embodiments, each planar gate 450 and the vertically-oriented gates therebeneath form a single transfer gate. For clarity of illustration, FIG. 4 does not illustrate the vertically-oriented gates. FIG. 9 illustrates vertical transfer gates 942 and 943, each of which are examples of said vertically-oriented gates. In the horizontal plane, each planar gate 450 (FIG. 4) may be tapered toward floating diffusion region 460. That is, the distal end of planar gate 450, located further from floating diffusion region 460, may be wider than its proximal end, located closer to floating diffusion region 460. This tapered shape, which maybe trapezoidal as illustrated in FIG. 4, facilitates charge transfer from photodiode 440 while reducing parasitic capacitance between planar gate 450 and floating diffusion region 460.

Herein, an element in the figures denoted by a reference numeral suffixed by a parenthetical numeral is an example of the element indicated by the reference numeral. Accordingly, and unless otherwise specified, a relationship between two elements with a suffix (m) also applies for those two elements with suffix (n≠m), where m and n are positive integers. While the following description refers to elements with parenthetical numeral (1), it may also apply to at least one of parenthetical numerals (2), (3), and (4). Attributes ascribed to pixel 400(1) or any elements thereof may also be respectively ascribed to one or more pixels 400(2-4) and any elements thereof.

Figure 5:
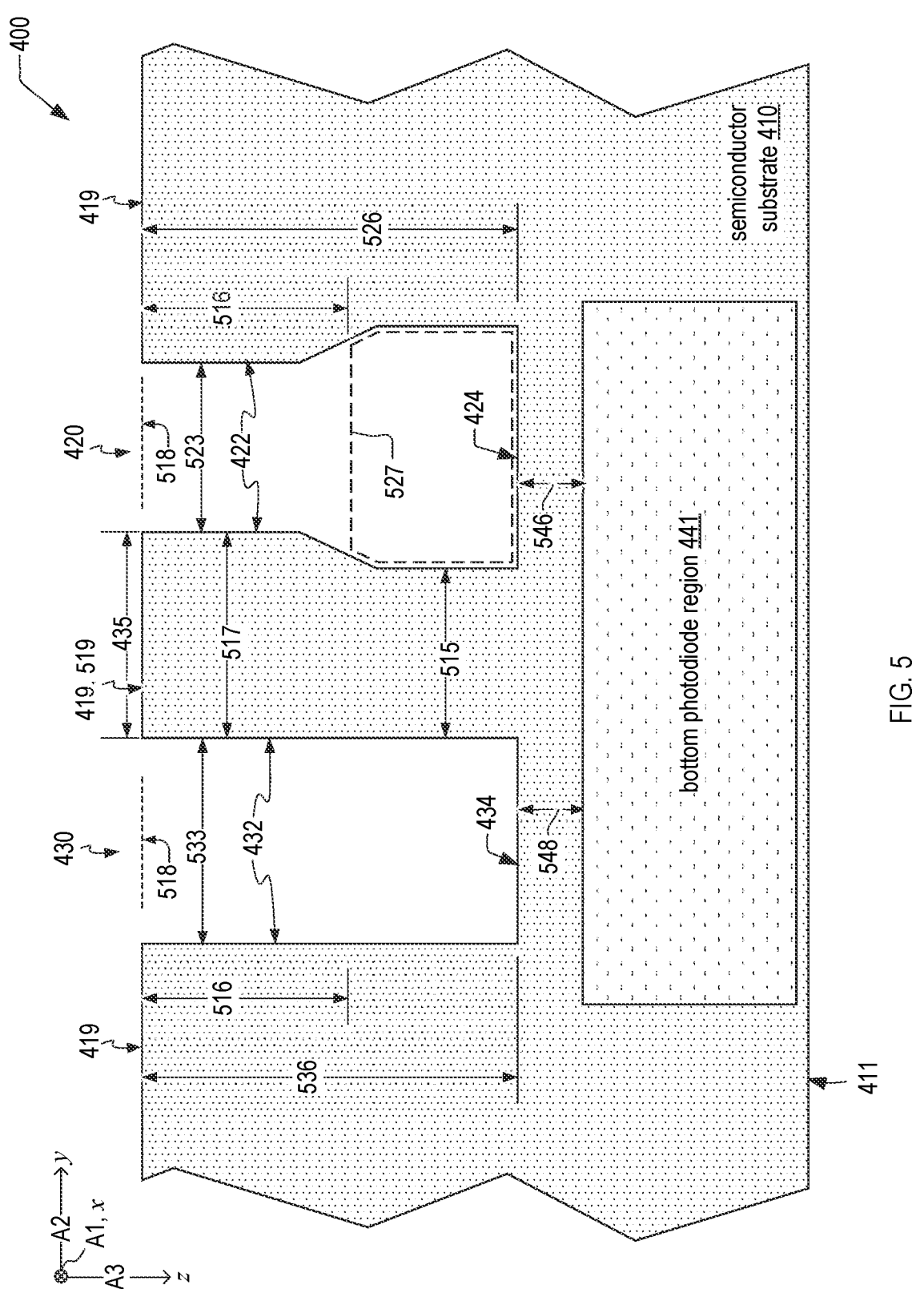
FIGS. 5, 6, and 7 are respective cross-sectional views of a pixel of the pixel-array substrate of FIG. 4, in an embodiment.
Figure 6:
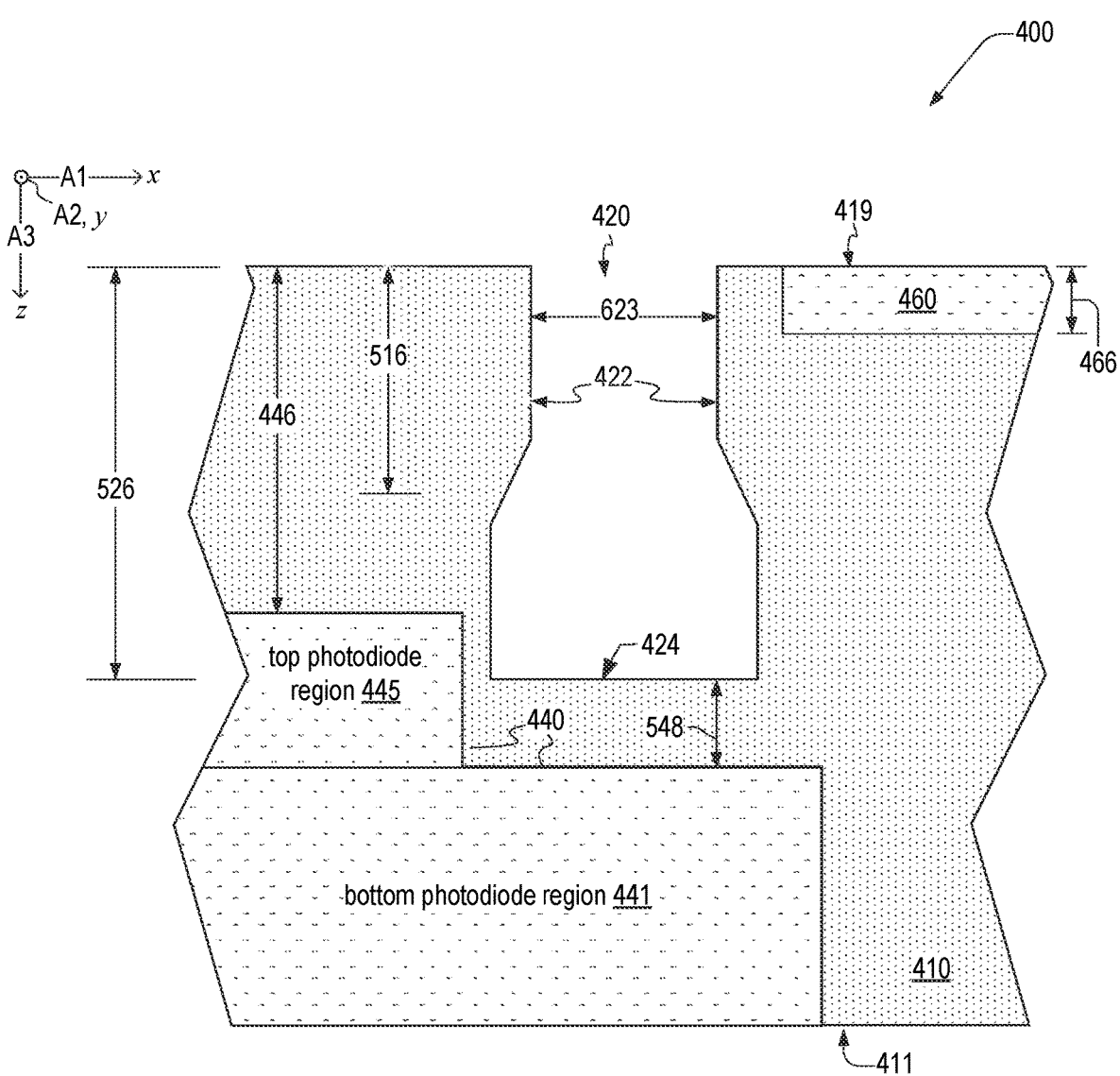
Figure 7:
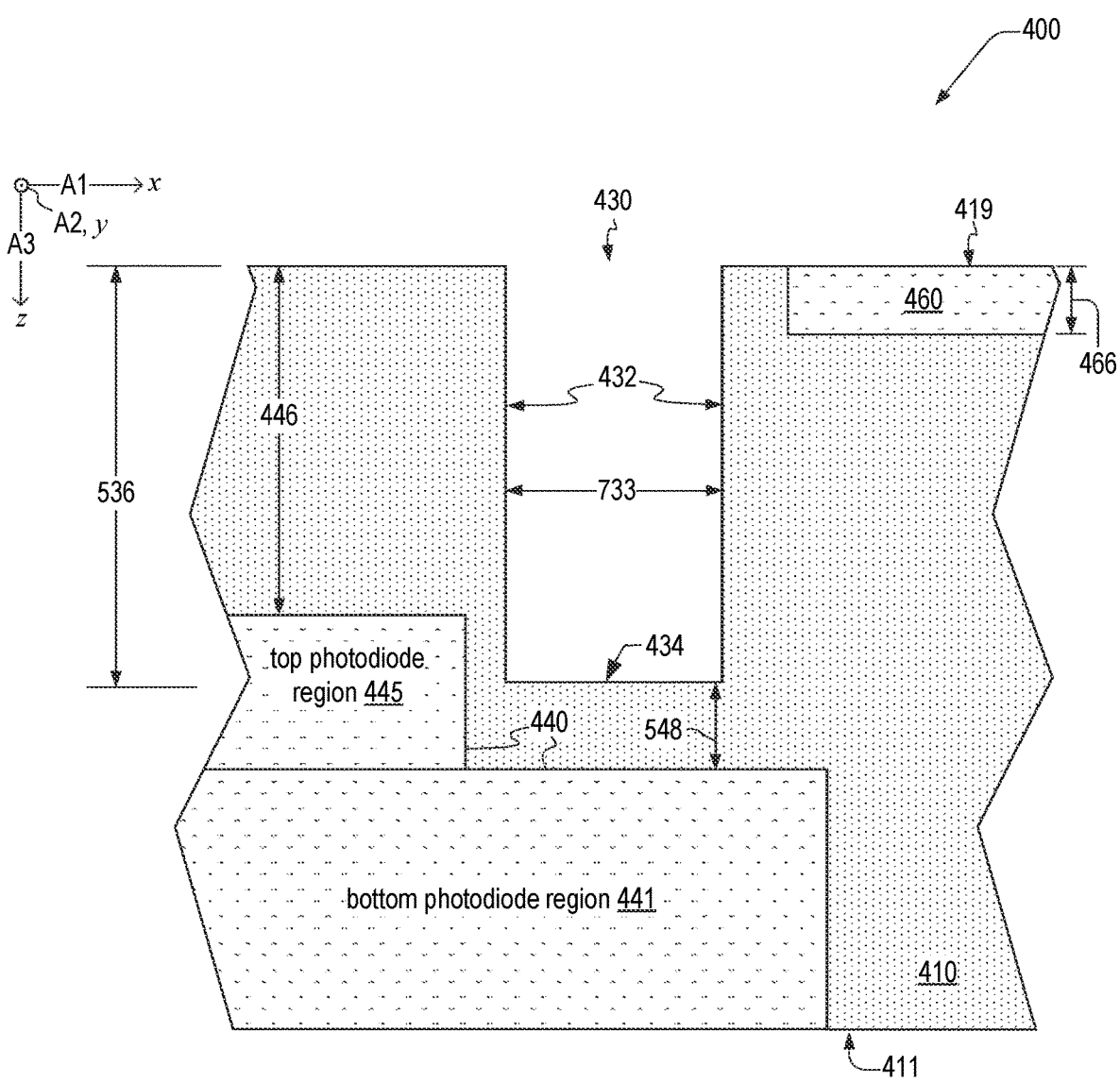

FIG. 5 is an example cross-sectional view of pixel 400 in cross-sectional plane 5-5' of FIG. 4. FIGS. 6 and 7 are cross-sectional views of pixel 400 in cross-sectional planes 6-6' and 7-7' of FIG. 4 respectively. FIGS. 5-7 are best viewed together in the following description. The orientation of axes A1 and A2 in FIGS. 5-10 correspond to pixels 400(1) and 400(2) of FIG. 4. The cross-sectional views of FIGS. 5-10 are equally applicable to pixels 400(3) and 400(4), in which case axes A1 and A2 are switched. That is, when axis A1 is horizontal and axis A2 is into the page, FIGS. 5-10 represent cross-sectional views of pixels 400(3) and 400(4).

Pixel 400 includes part of semiconductor substrate 410 and, formed therein, photodiode 440 and floating diffusion region 460. Semiconductor substrate 410 includes, between surfaces 411 and 419, sidewall surfaces 422 and 432, and bottom surfaces 424 and 434. Sidewall surface 422 and 424 form a concave surface that defines trench 420, which has a trench depth 526 with respect to front surface 419. Sidewall surface 432 and bottom surface 434 form a concave surface that defines trench 430, which has a trench depth 536 with respect to front surface 419. In embodiments, each of trench depths 526 and 536 is between 0.3 micrometers and 0.6 micrometers. In embodiments, depths 526 and 536 are equal. Herein, and unless otherwise noted, a depth is a distance along a direction parallel to axis A3.

FIG. 4 also denotes a plane 428 which is parallel to the x-z plane, perpendicular to front surface 419, and intersects photodiode regions 440 of pixels 400(1,2) and a center of floating diffusion region 460.

FIG. 5 denotes a plane 518 that includes front surface 419 and spans between opposing regions of sidewall surface 422 and opposing regions of sidewall surface 432. Trench depth 526's being with respect to front surface 419 means that trench depth 526 is a vertical distance between bottom surface 424 and plane 518. Similarly, trench depth 536's being with respect to front surface 419 means that trench depth 536 is a vertical distance between bottom surface 434 and plane 518. Front surface 419 includes an inter-trench region 519 between trenches 420 and 430. Each of depths 526 and 536 exceeds a junction depth 466 of floating diffusion region 460 with respect to front surface 419.

Photodiode 440 includes a bottom photodiode region 441, shown in FIGS. 5 and 6, and a top photodiode region 445 shown in FIG. 6. In embodiments, at least part of each of bottom surface 424 and bottom surface 434 is above bottom photodiode region 441, as illustrated in FIGS. 5 and 6. In respective cross-sectional planes parallel to the x-z plane, part of top photodiode region 445 is adjacent to each of trenches 420 and 430.

Top photodiode region 445 is formed at depth 446 with respect to front surface 419. In embodiments, top photodiode region 445 and floating diffusion region 460 are formed on opposite sides of trenches 420, 430. In embodiments, top photodiode region 445 and bottom photodiode region 441 are configured such that most of photo-generated charges are accumulated in bottom photodiode region 441 and most of photo-generated charges enters a conduction channel of vertical transfer gates (e.g., formed by vertical transfer gates 942, 943 upon reception of a transfer signal such as a positive biasing voltage) through top photodiode region 445. In embodiments, a concentration of top photodiode region 445 is greater than a concentration of bottom photodiode region 441. In embodiments, top photodiode region 445 and bottom photodiode region 441 have a gradient doping profile.

FIG. 5 denotes distances 546 and 548 between photodiode region 441 and bottom surfaces 424 and 434, respectively. In embodiments, each of distances 546 and 548 is between 60 nm and 250 nm. Trenches 420 and 430 have respective widths 523 and 533, shown in FIG. 5, and respective lengths 623 and 733 shown in FIGS. 6 and 7, each of which are, in embodiments, between 0.05 micrometers and 0.3 micrometers. In embodiments, lengths 623 and 733 are substantially equal, e.g., their relative difference is less than five percent.

Adjacent trenches 420 and 430 are separated by a distance 435 on front surface 419. In embodiments, distance 435 is either parallel or perpendicular to axis A2 depending on orientation. For example, for pixels 400(1,2) distance 435 is parallel to axis A2, and for pixels 400(3) and 400(4), distance 435 is perpendicular to axis A2. In embodiments, distance 435 is between 0.03 micrometers and 0.3 micrometers. In embodiments, distance 435 is between 0.14 micrometers and 0.3 micrometers, which reduces blooming, as discussed below. FIG. 5 denotes a depth 516 that is less than each of depths 526 and 536. Between depth 516 and front surface 419, "upper distances" between trenches along axis A2 may be constant or vary as a function of depth beneath front surface 419. FIG. 5 denotes an average upper-separation 517, which is an average of said upper distances. Similarly, between depth 516 and bottom surface 424 of trench 420, "lower distances" between trenches 420 and 430 along axis A2 may be constant or vary as a function of depth beneath depth 516. FIG. 5 denotes an average lower-separation 515, which is an average of said lower distances. In embodiments, depth 516 is at least one of greater than junction depth 466 and less than depth 446.

When average separations 515 and 517 are equal to a uniform separation distance, blooming decreases as this uniform separation increases, while image lag increases as the uniform separation increases. The inventors have realized that blooming is more sensitive to average upper-separation 517 while image lag is more sensitive to the value of average lower-separation 515. Accordingly, average upper-separation 517 exceeds average lower-separation 515, which enables reduction of both blooming and image lag.

In embodiments, depth 516 and average separations 515 and 517 satisfy at least one of the following, which enables reduction of both blooming and image lag: (a) depth 516 is between one-third and two-thirds of each of trench depths 526 and 536; (b) depth 516 is between than 0.18 micrometers and 0.22 micrometers, (c) a ratio of average upper-separation 517 to width 533 or width 523 (at plane 518) is between 1.0 and 1.5; and (d) a ratio of average lower-separation 515 to width 533 or width 523 (at plane 518) is between 0.5 and 0.8.

In embodiments, average lower-separation 515 is less than or equal to 0.11 micrometers, which reduces image lag. In embodiments, average-lower separation 515 exceeds a process margin (e.g., a semiconductor technology node defined by lithography processes) of the process used to fabricate pixel-array substrate 490. An example process margin is eighty nanometers. In embodiments, average upper-separation 517 is greater than or equal to 0.14 micrometers, which reduces blooming. In embodiments, a maximum value upper-separation 517 is limited by available area within each pixel 400, which is in part determined by the pixel pitch of pixel array 112A.

In embodiments, at least one of width 523 of trench 420 and width 533 of trench 430 is non-uniform (e.g., varying) as a function of depth. For example, width 523 is non-uniform between plane 518 and bottom surface 424. For example, the average of width 523 of trench 420 beneath depth 516 is exceeds the average of width 523 above depth 516. In embodiments, each of widths 523 and 533 is substantially uniform (e.g., constant) between plane 518 and depth 516. In embodiments, each of widths 523 and 533 is nonuniform at depths exceeding depth 516. When width 523 is non-uniform as a function of depth, length 623 may be either uniform or non-uniform as a function of depth. When width 533 is non-uniform as a function of depth, length 633 may be either uniform or non-uniform as a function of depth.

A width that deviates from its average by less than ten percent is an example of a substantially uniform width. Within a range of depths beneath front surface 419, a width that deviates from its average by less than ten percent is an example of a substantially uniform width, while a width with a larger deviation is an example of nonuniform width.

In the example of FIG. 5, the cross-sectional shape of trench 420 between depth 516 and bottom surface 424 is, in the y-z plane, is that of a hexagon with two right angles, as denoted by dashed shape 527. In embodiments, dashed shape 527, and hence a cross-sectional shape of trench 420 below depth 516 is one of a rectangle, a trapezoid, a polygon, an ellipse, a circle, and any combination thereof.

Figure 8:
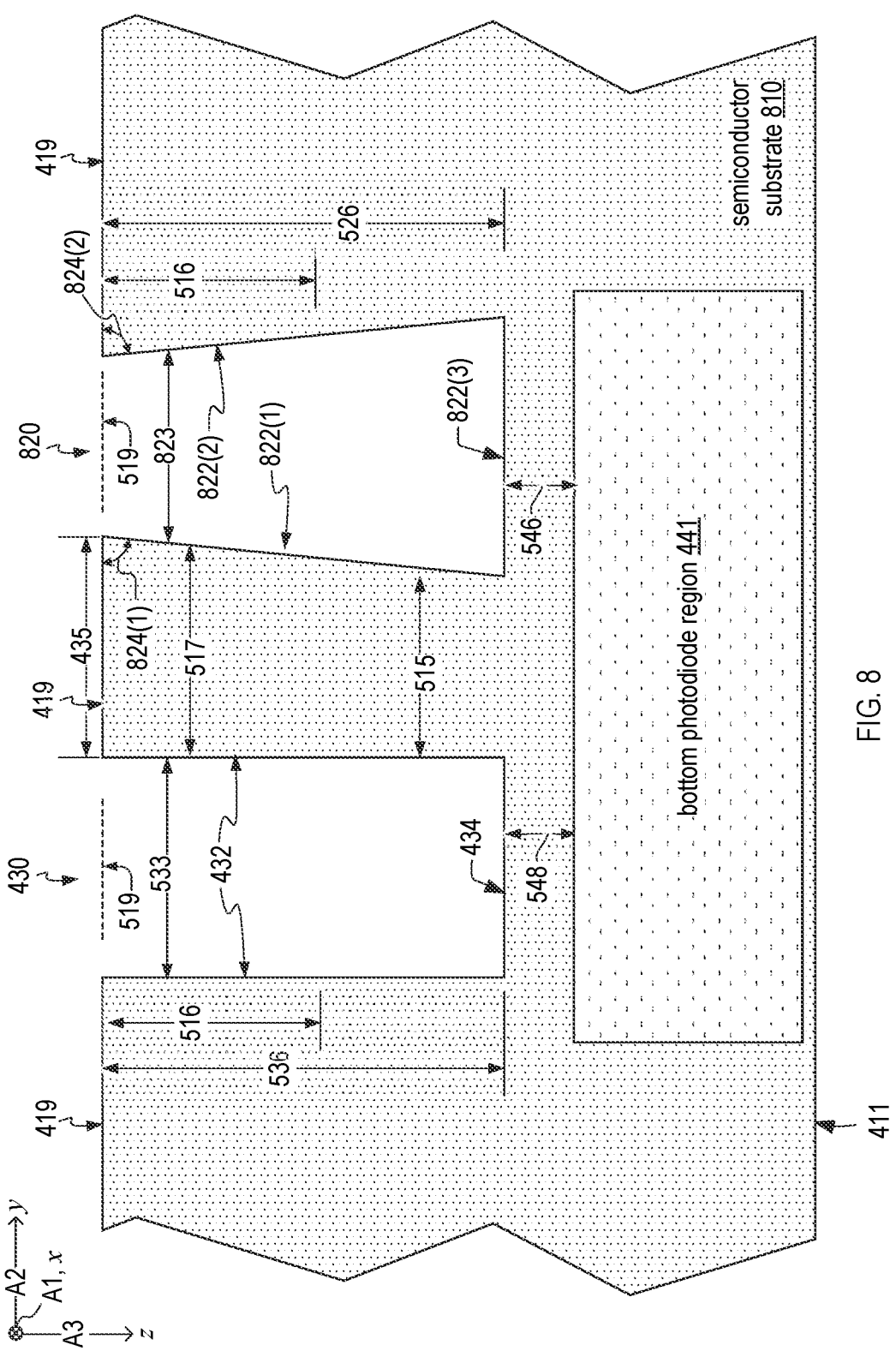
FIG. 8 is a cross-sectional view of the semiconductor substrate pixel-array substrate of FIG. 4, in an embodiment.

FIG. 8 is an example cross-sectional view of a semiconductor substrate 810 in cross-sectional plane 5-5' of pixel 400(1) in FIG. 4. Semiconductor substrate 810 has a concave surface 822 that defines a trench 820, which is an example of trench 420. Concave surface 822 includes opposing sidewall surface sections 822(1) and 822(2) and a bottom surface section 822(3). Semiconductor substrate 810 and sidewall surface sections 822(1,2) are respective examples of semiconductor substrate 410, surface 422, FIG. 4. Bottom surface section 822(3) is an example of bottom surface 424. Sidewall surface sections 822(1,2) span between front surface 419 and trench depth 526. Trench 820 has a width 823 that monotonically increases between plane 519 and bottom surface section 822(3). When width 823 linearly increases between plane 519 and bottom surface section 822(3), trench 820 has a trapezoidal cross-section.

FIG. 8 denotes angles 824(1) and 824(2) between front surface 419 and sidewall surface sections 822(1) and 822(2) respectively. In embodiments, angle 824 deviates from ninety degrees by less than two degrees. When either or both of sidewall surface sections 822(1,2) is not linear in cross-sectional plane 5-5', angle 824(1,2) is between front surface 419 and a linear fit to surface section 822(1,2).

Figure 10:
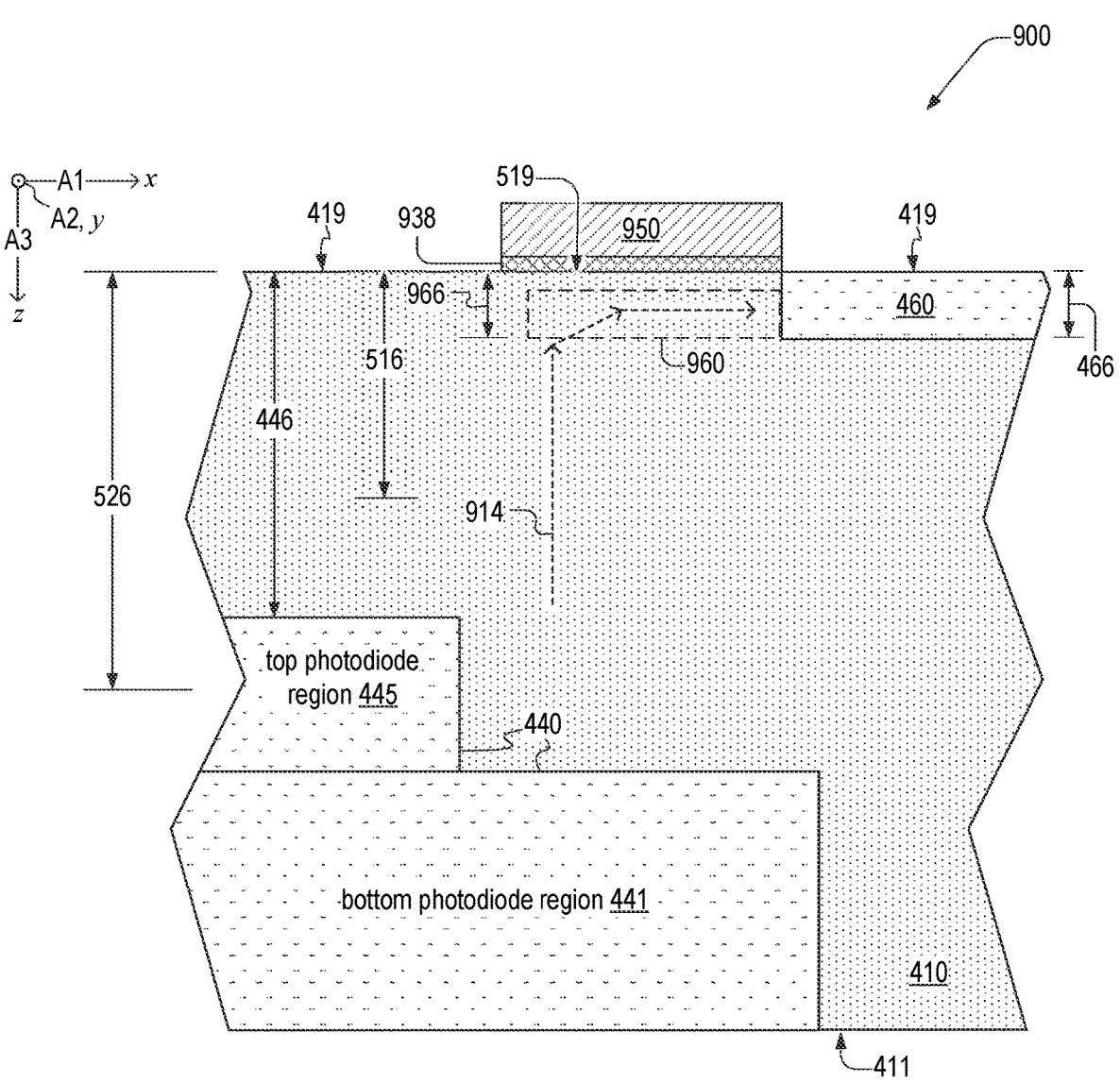

FIGS. 9 and 10 are respective cross-sectional views of a pixel cell 900, which is pixel 400 with the addition of a transfer gate comprising a planar gate 950, a vertical transfer gate 942, and a vertical transfer gate 943. The cross-sectional views of FIGS. 9 and 10 are in cross-sectional plane 5-5' and 10-10' of FIG. 4, respectively. Planar gate 950 is an example of planar gate 450, FIG. 4.

Planar gate 950 is on part of front surface 419 surrounding trenches 420 and 430, and also on inter-trench region 519. Planar gate 950 spans between trench 420 and trench 430. Vertical transfer gate 942 at least partially fills trench 420 and is electrically connected to planar gate 950. Vertical transfer gate 943 at least partially fill trench 430 and is electrically connected to planar gate 950.

Planar gate 950, vertical transfer gate 942, and vertical transfer gate 943 constitute a gate electrode for a transfer gate coupling photodiode 440 to floating diffusion region 460. In embodiments, pixel cell 900 includes a gate dielectric layer 938 located between the gate electrode and each of surfaces 422, 424, 432, 434, and inter-trench region 519. Gate dielectric layer 938 may be a single continuous layer on each of the aforementioned surfaces and region. In embodiments, and independent of the presence of gates 950, 942, and 943, pixel 400 includes gate dielectric layer 938 on each of surfaces 422, 424, 432, 434, and inter-trench region 519.

In FIG. 9, the midpoint between vertical transfer gates 942 and 943 is at y=0. When vertical transfer gates 942 and 943 are held at a constant electric potential $V_1$, the electric potential as a function of y and z is, via twice integrating Poisson's equation for electrostatics and applying a boundary condition that $\phi(W(z)/2,z)=V_1$, $\phi(y,z)=4V_1(y/W(z))^2$.

Quantity W(z) is a height-dependent separation between vertical transfer gates 942 and 943. The average of separations W(z) above and below depth 516 are, respectively, average upper-separation 517 and average lower-separation 515. Accordingly, for a non-zero value of y, the electric potential increases from below depth 516 to above depth 516. This potential difference results in a photocurrent 914 of photoelectrons generated in photodiode region 441 that flows upward from photodiode region 441 in the −z direction toward inter-trench region 519. FIG. 9 denotes part of floating diffusion region 460, which is behind the plane of FIG. 9. In a region of semiconductor substrate 410 between vertical transfer gates 942 and 943 and above depth 516, photocurrent 914 flows toward floating diffusion region 460 when vertical transfer gates 942 and 943 is biased to turn on (e.g., a control circuit applies a negative voltage signal to the transfer gate of pixel cell 900), as denoted by the into-page vector symbol ⊗ in FIG. 9 and a horizontal arrow in FIG. 10.

In embodiments, semiconductor substrate 410 includes a doped blooming region 960 underneath planar gate 950 and in between vertical transfer gates 942 and 943. Doped blooming region 960 is further arranged, as shown in FIG. 10, in between top photodiode region 445 and floating diffusion region 460 along axis A1. Doped blooming region 960 facilitates coupling between photodiode 440 and floating diffusion region 460. Doped blooming region 960 provides a blooming path between from photodiode 440 to floating diffusion region 460 for excess charges to flow from photodiode 440 to floating diffusion region 460 when transfer gate (e.g., vertical transfer gates 943, 943, and planar gate 950) are biased to turn off (e.g., a control circuit applies a negative voltage signal to the transfer gate) during an integration when photodiode 440 is near saturation or become saturated. Doped blooming region 960 extends to a depth 966 beneath front surface 419. Depth 966 is less than or equal to depth 516. In embodiments, doped blooming region 960 has a conductive type same as that of the floating diffusion region 460.

Figure 11:
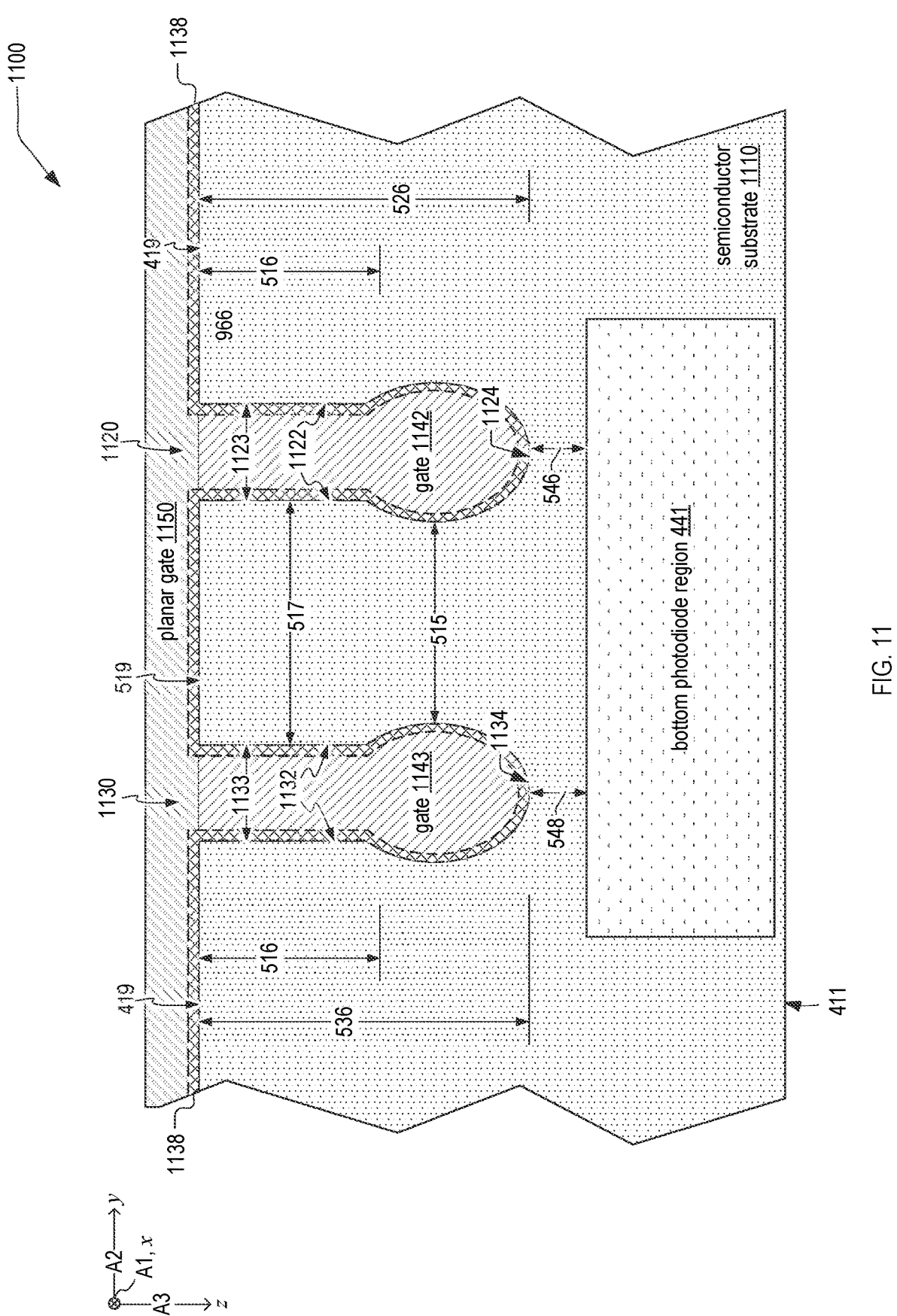
FIG. 11 is a cross-sectional view of the pixel cell of FIG. 4 with the addition of a planar gate and two vertical gates, in a second embodiment.

FIG. 11 is a cross-sectional view of a pixel cell 1100, which is pixel cell 400 with a semiconductor substrate 1100, and the addition of a transfer gate comprising a planar gate 1150, a vertical gate 1142, and a vertical gate 1143. Semiconductor substrate 1110, vertical gates 1142 and 1143, and planar gate 1150 are respective examples of semiconductor substrate 410, vertical transfer gates 942 and 943, and planar gate 940. Semiconductor substrate 1110 includes surfaces 411, 419, 519, 1122, 1124, 1132, and 1134. Surfaces 1122, 1124, 1132, and 1134 are respective examples of surfaces 422, 424, 432, and 434 of semiconductor substrate 410. Semiconductor substrate 1110 also includes trenches 1120 and 1130, which are respective examples of trenches 420 and 430. At depths exceeding depth 516, and in the cross-sectional plane of FIG. 11, a cross-section of trench 1120 and trench 1130 is a truncated ellipse. In embodiments, surfaces 1122 and 1132 each form a truncated ellipsoid at depths exceeding depth 516. Trenches 1120 and 1130 have non-uniform widths 1123 and 1133 respectively, which may be equal.

FIG. 12 is a flowchart illustrating a method 1200 for creating an artifact-reduced pixel of an image sensor. Method 1200 includes steps 1210, 1220, and 1230, and in embodiments results in the shared pixel cell that includes multiple pixels 400. Method 1200 may also include step 1240.

Step 1210 includes determining a first gate-spacing of the pixel cell at which blooming artifacts are less than a blooming threshold. In embodiments, the blooming threshold is between 0.1 percent and ten percent. The blooming threshold may be less than ten percent, e.g., when image sensor 192 is a CMOS image sensor, such as one that does not capture high-dynamic range (HDR) images. In embodiments, the blooming threshold is less than three percent, for example, when image sensor 192 is a HDR image sensor, such as an HDR CMOS image sensor. In an example of step 1210, average upper-separation 517 is determined.

Step 1220 includes determining a second gate-spacing of the pixel cell at which image lag artifacts are less than an image-lag threshold. In embodiments, the image-lag threshold may vary based on an image sensor performance requirement for different light conditions such as low light condition or high light condition. Image lag artifacts can be measured by imaging at different light conditions, for example by low light lag measurement and high light lag measurement, which are common measuring techniques known in image sensor field. In some embodiments, the image-lag threshold is defined as less than one electron at pixel level as measured in low-light conditions. In an example of step 1220, average lower-separation 515 is determined.

Step 1230 includes forming a pair of trenches in a substrate and adjacent to a photodiode region formed in the substrate. A first average spacing between the trenches above a first depth, with respect to a top surface of the substrate, is equal to the first gate-spacing. A second average spacing between the trenches below the first depth is equal to the second gate-spacing. In an example of step 1230, trenches 420 and 430 are formed in semiconductor substrate 410 adjacent to top photodiode region 445.

Step 1240 includes implanting, in the substrate, a floating diffusion region in that extends to a junction depth that exceeds the first depth. Each of the pair of trenches is between the floating diffusion region and the photodiode region. In an example of step 1240, floating diffusion region 460 is implanted into semiconductor substrate 410 to junction depth 466. Implantation of floating diffusion region 460 may occur after gate electrodes (e.g., gates 942, 943, and 950) are formed on semiconductor substrate and into respective trenches 420, 430.

In embodiments, method 1200 further includes implanting, in the substrate, the photodiode region adjacent to the pair of trenches. For example, photodiode region 440 is implanted into semiconductor substrate 410. Implantation of photodiode region 440 may occur before the pair of trenches (e.g., trenches 420, 430) are formed in the semiconductor substrate 410.

In embodiments, method 1200 further includes implanting, in the substrate, a doped blooming region that i) forms between the photodiode region and floating diffusion region, ii) forms in between to the pair of trenches and iii) has a junction depth beneath front surface of semiconductor substrate being less than or equal to first depth. The doped blooming region, the photodiode region, and the floating diffusion region are of same conductive type. For example, doped blooming region 960 is formed between photodiode region 440 and floating diffusion region 460 and between vertical transfer gates 942, 943. Implantation of doped blooming region 960 may occur before the pair of trenches (e.g., trenches 420, 430) are formed in the semiconductor substrate 410.

Combinations of Features

Features described above as well as those claimed below may be combined in various ways without departing from the scope hereof. The following enumerated examples illustrate some possible, non-limiting combinations.

(A1) A pixel includes a semiconductor substrate that includes a floating diffusion region and a photodiode region. The pixel also includes, between a front surface of the semiconductor substrate and a back surface opposing the front surface: a first trench and a second trench adjacent to the first trench in a separation direction that is both (a) parallel to the front surface and (b) in a plane that is perpendicular to the front surface. Each of the first and second trench (a) is between the floating diffusion region and the photodiode region and (b) extends into the semiconductor substrate from the front surface. In the separation direction, a top average-separation between the first and second trench, at depths between the front surface and a first depth in the semiconductor substrate, exceeds a bottom average-separation between the first and second trench, at depths exceeding the first depth.

(A2) In embodiments of pixel (A1), the first depth is between 0.18 micrometers and 0.22 micrometers.

(A3) In embodiments of either one of pixels (A1) and (A2), the bottom average-separation being less than or equal to 0.11 micrometers.

(A4) In embodiments of any one of pixels (A1)-(A3), the top average-separation is greater than or equal to 0.14 micrometers.

(A5) In embodiments of any one of pixels (A1)-(A4), the first trench and the second trench have, respectively, a first trench depth and a second trench depth with respect to the front surface. The first depth is between one-third and two-thirds of each of the first trench depth and the second trench depth.

(A6) In embodiments of any one of pixels (A1)-(A5), a ratio of a trench width to the top average-separation is between 1.0 and 1.5. The trench width is at least one of a first width of the first trench and a second width of the second trench in the separation direction and in a plane of the front surface.

(A7) In embodiments of any one of pixels (A1)-(A6), a ratio of a trench width to the bottom average-separation is between 0.5 and 0.8. The trench width is at least one of a first width of the first trench and a second width of the second trench in the separation direction and in a plane of the front surface.

(A8) In embodiments of any one of pixels (A1)-(A7), in the separation direction: (i) the first trench has a substantially uniform width as a function of depth beneath the front surface, and (ii) the second trench has a non-uniform width as a function of depth beneath the front surface.

(A9) In embodiments of any one of pixels (A1)-(A8), the semiconductor substrate includes, between the front surface and the back surface, a first concave surface that defines the first trench. In the plane, the first concave surface is trapezoidal and including two opposing sidewall surfaces spanning between the front surface and a depth of the first trench. An angle between at least one of the two opposing sidewall surfaces and the front surface deviates from ninety degrees by less than two degrees.

(A10) In embodiments of any one of pixels (A1)-(A9), in the separation direction: each of the first trench and the second trench having a nonuniform width as a function of depth beneath the front surface.

(A11) In embodiments of any one of pixels (A1)-(A10), in the separation direction and at depths less than the first depth, each of the first trench and the second trench having a substantially uniform width as a function of depth beneath the front surface.

(A12) In embodiments of any one of pixels (A1)-(A11), in the separation direction and at depths exceeding the first depth, each of the first trench and the second trench having a nonuniform width as a function of depth beneath the front surface.

(A13) In embodiments of any one of pixels (A1)-(A12), in the plane and beneath the first depth, a cross-sectional shape of at least one of the first trench and the second trench being one of: rectangular, trapezoidal, circular, elliptical, and any combination thereof.

(A14) Embodiments of any one of pixels (A1)-(A13) further include a planar gate, a first vertical gate, and a second vertical gate. The planar gate is on an inter-trench region of the front surface between the first trench and the second trench and spanning between the first trench and the second trench. The first vertical gate at least partially fills the first trench and electrically connected to the planar gate. The second vertical gate at least partially fills the second trench and electrically connected to the planar gate.

(A15) In embodiments of pixel (A14): (i) the semiconductor substrate includes, between the front surface and the back surface, a first and a second concave surface that define the first and second trench respectively; and (ii) the planar gate, the first vertical gate, and the second vertical gate constitute a gate electrode. Such embodiments may further include a gate dielectric layer located between the gate electrode and each of (i) the first and second concave surfaces and (ii) the inter-trench region.

(B1) A pixel cell includes a semiconductor substrate and a plurality of transfer gates. The semiconductor substrate includes a floating diffusion region, a plurality of photodiodes, and a front surface. Each of the plurality of transfer gates (i) is located on a surface of the semiconductor substrate, (ii) couples a respective one of the plurality of photodiodes to the floating diffusion region, and (iii) includes a planar gate, a first vertical gate, and a second vertical gate laterally displaced from the first vertical gate in a separation direction. Each of the first vertical gate and the second vertical gate extends from the planar gate into the semiconductor substrate. The first and the second vertical gates are proximate to the respective one of the plurality of photodiodes. In the separation direction, a top average-separation between the first and the second vertical gates and between the front surface and a first depth in the semiconductor substrate exceeds a bottom average-separation between the first and the second vertical gates at depths exceeding the first depth. The separation direction is parallel to the front surface and in a plane that is (i) perpendicular to the front surface and (ii) intersects both the first and the second vertical gates.

(B2) In embodiments of pixel cell (B1), the floating diffusion region extends from the front surface to a junction depth in the semiconductor substrate, and each of the plurality of photodiodes is disposed in the semiconductor substrate at a second depth. The second depth is greater than the junction depth of the floating diffusion region. In such embodiments, the first depth is greater than the junction depth of the floating diffusion region and less than the second depth of each of the plurality of photodiodes.

(B3) In embodiments of either one of pixels (B1) and (B2), the first vertical gate and the second vertical gate have, respectively, a first gate depth and a second gate depth with respect to the front surface. The first depth is between one-third and two-thirds of each of the first gate depth and the second gate depth.

(B4) In embodiments of any one of pixels (B1)-(B3), in the separation direction: (i) the first vertical gate has a substantially uniform width as a function of depth beneath the front surface, and (ii) the second vertical gate has a non-uniform width as a function of depth beneath the front surface.

(B5) In embodiments of any one of pixels (B1)-(B4), the semiconductor substrate includes, between the front surface and the back surface, a first concave surface that defines a first trench for the first vertical gate. In the plane, the first concave surface is trapezoidal and including two opposing sidewall surfaces spanning between the front surface and a depth of the first trench. An angle between at least one of the two opposing sidewall surfaces and the front surface deviates from ninety degrees by less than two degrees.

(B6) In embodiments of any one of pixels (B1)-(B5), in the separation direction: each of the first vertical gate and the second vertical gate having a nonuniform width as a function of depth beneath the front surface.

(B7) In embodiments of any one of pixels (B1)-(B6), in the separation direction and at depths less than the first depth, each of the first vertical gate and the second vertical gate having a substantially uniform width as a function of depth beneath the front surface.

(B8) In embodiments of any one of pixels (B1)-(B7), in the separation direction and at depths exceeding the first depth, each of the first vertical gate and the second vertical gate having a nonuniform width as a function of depth beneath the front surface.

(B9) In embodiments of any one of pixels (B1)-(B8), in the plane and beneath the first depth, a cross-sectional shape of at least one of the first vertical gate and the second vertical gate being one of: rectangular, trapezoidal, circular, elliptical, and any combination thereof.

(B10) In embodiments of any one of pixels (B1)-(B9), the first vertical gate is formed in the first trench of any one of pixels (A1)-(A15), and the second vertical gate is formed in the second trench of any one of pixels (A1)-(A15).

(C1) A method for creating an artifact-reduced pixel of an image sensor, the method includes: (i) determining a first gate-spacing of the pixel cell at which blooming artifacts are less than a blooming threshold; (ii) determining a second gate-spacing of the pixel cell at which image lag artifacts are less than an image-lag threshold; and (iii) forming a pair of trenches in a substrate and adjacent to a photodiode region of the substrate. A first average spacing between the trenches above a first depth, with respect to a top surface of the substrate, is equal to the first gate-spacing. A second average spacing between the trenches below the first depth is equal to the second gate-spacing.

(C2) Embodiments of method (C1) further include implanting, in the substrate, a floating diffusion region that extends to a junction depth that exceeds the first depth, each of the pair of trenches being between the floating diffusion region and the photodiode region.

(C3) Embodiments of either one of methods (C1) and (C2) further include (i) implanting, adjacent to the pair of trenches, the photodiode region in the substrate at a depth that exceeds the first depth; and (ii) implanting, between the photodiode region and the floating diffusion region, a doped blooming region in the substrate to a junction depth that is less than or equal to the first depth.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A pixel, comprising:
a semiconductor substrate that includes a floating diffusion region and a photodiode region and, between a front surface of the semiconductor substrate and a back surface opposing the front surface: a first trench and a second trench adjacent to the first trench in a separation direction, the separation direction being (a) parallel to the front surface and (b) in a separation-direction plane that is perpendicular to the front surface;
each of the first trench and the second trench, the floating diffusion region, and the photodiode region being in a plane that is perpendicular to both the front surface and the separation-direction plane, each of the first trench and the second trench (a) being between the floating diffusion region and the photodiode region and (b) extending into the semiconductor substrate from the front surface;
in the separation direction, a top average-separation between the first trench and the second trench, within a depth range spanning between the front surface and a first depth in the semiconductor substrate, exceeding a bottom average-separation between the first trench and the second trench, at depths that exceed the first depth;
the first trench having a first bottom surface at a first trench-depth relative to the front surface;
the second trench having a second bottom surface at a second trench-depth relative to the front surface; and
a minimum distance between the photodiode region and the front surface exceeding both of the first trench-depth and the second trench-depth.

2. The pixel of claim 1, the first trench and the second trench having, respectively, a first trench depth and a second trench depth with respect to the front surface, the first depth being between one-third and two-thirds of each of the first trench depth and the second trench depth.

3. The pixel of claim 1, a ratio of a trench width to the top average-separation being between 1.0 and 1.5, the trench width being at least one of a first width of the first trench and a second width of the second trench in the separation direction and in an additional plane that is parallel to the front surface.

4. The pixel of claim 1, a ratio of a trench width to the bottom average-separation being between 0.5 and 0.8, the trench width being at least one of a first width of the first trench and a second width of the second trench in the separation direction and in an additional plane that is parallel to the front surface.

5. The pixel of claim 1, in the separation direction: (i) the first trench having a first width that is substantially uniform between the front surface and the back surface, and (ii) the second trench having a second width that is non-uniform between the front surface and the back surface.

6. The pixel of claim 1, in the separation direction: each of the first trench and the second trench having a nonuniform width as a function of the depths beneath the front surface.

7. The pixel of claim 1, in the separation direction: each of the first trench and the second trench having a nonuniform width as a function of depth beneath the front surface.

8. The pixel of claim 1, in the separation direction and at depths less than the first depth, each of the first trench and the second trench having a substantially uniform width as a function of depth beneath the front surface.

9. The pixel of claim 1, in the separation direction and at depths exceeding the first depth, each of the first trench and the second trench having a nonuniform width as a function of the depths beneath the front surface.

10. The pixel of claim 1, in the separation-direction plane and beneath the first depth, a cross-sectional shape of at least one of the first trench and the second trench being one of: rectangular, trapezoidal, and elliptical.

11. The pixel of claim 1, further comprising a transfer gate that (i) couples the photodiode to the floating diffusion region and (ii) includes:
a planar gate on an inter-trench region of the front surface between the first trench and the second trench and spanning between the first trench and the second trench;
a first vertical gate at least partially filling the first trench and electrically connected to the planar gate; and
a second vertical gate at least partially filling the second trench and electrically connected to the planar gate.

12. The pixel of claim 11,
the semiconductor substrate including, between the front surface and the back surface, a first concave surface and a second concave surface that define the first trench and the second trench respectively,
the planar gate, the first vertical gate, and the second vertical gate constituting a gate electrode, and further comprising:
a gate dielectric layer located between the gate electrode and each of (i) the first concave surface and the second concave surface and (ii) the inter-trench region.

13. The pixel of claim 1, the semiconductor substrate including a doped region between the photodiode region and the floating diffusion region, a minimum distance between the doped region and the front surface being not exceeding the first depth.

14. A pixel cell, comprising:
a semiconductor substrate that includes a floating diffusion region, a plurality of photodiodes, and a front surface; and
a plurality of transfer gates each (i) coupling a respective one of the plurality of photodiodes to the floating diffusion region, and (ii) including a planar gate located on the front surface of the semiconductor substrate, a first vertical gate, and a second vertical gate laterally displaced from the first vertical gate in a separation direction, the separation direction being (a) parallel to the front surface and (b) in a separation-direction plane that is perpendicular to the front surface;
each of the first vertical gate and the second vertical gate, the floating diffusion region, and the respective one of the plurality of photodiodes being in a plane that is perpendicular to both the front surface and the separation-direction plane,
each of the first vertical gate and the second vertical gate (a) being between the floating diffusion region and the photodiode region and (b) extending from the planar gate into the semiconductor substrate,
in the separation direction, a top average-separation between the first vertical gate and the second vertical gate and between the front surface and a first depth in the semiconductor substrate exceeding a bottom average-separation between the first vertical gate and the second vertical gate at depths exceeding the first depth.

15. The pixel cell of claim 14,
the floating diffusion region extending from the front surface to a junction depth in the semiconductor substrate;

within the semiconductor substrate, a minimum distance between the front surface and the plurality of photo-diodes being greater than the junction depth of the floating diffusion region, the first depth being greater than the junction depth of the floating diffusion region and less than the second depth of each of the plurality of photodiodes.

16. A pixel, comprising:

a semiconductor substrate that includes a floating diffu-sion region and a photodiode region and, between a front surface of the semiconductor substrate and a back surface opposing the front surface: a first trench and a second trench adjacent to the first trench in a separation direction, the separation direction being (a) parallel to the front surface and (b) in a separation-direction plane that is perpendicular to the front surface;

each of the first trench and the second trench, the floating diffusion region, and the photodiode region being in a plane that is perpendicular to both the front surface and the separation-direction plane, each of the first trench and the second trench (a) being between the floating diffusion region and the photodiode region and (b) extending into the semiconductor substrate from the front surface;

in the separation direction, a top average-separation between the first trench and the second trench, within a depth range spanning between the front surface and a first depth in the semiconductor substrate, exceeding a bottom average-separation between the first trench and the second trench, at depths that exceed the first depth.

17. The pixel of claim 16, in the separation direction: (i) the first trench having a first width that is substantially uniform between the front surface and the back surface, and (ii) the second trench having a second width that is non-uniform between the front surface and the back surface.

* * * * *